(12) United States Patent
Pedersen

(10) Patent No.: US 8,675,398 B2
(45) Date of Patent: Mar. 18, 2014

(54) VOLATILE MEMORY ELEMENTS WITH SOFT ERROR UPSET IMMUNITY

(71) Applicant: Altera Corporation, San Jose, CA (US)

(72) Inventor: Bruce B. Pedersen, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/924,389

(22) Filed: Jun. 21, 2013

(65) Prior Publication Data

US 2013/0279242 A1 Oct. 24, 2013

Related U.S. Application Data

(63) Continuation of application No. 13/411,436, filed on Mar. 2, 2012, now Pat. No. 8,482,965, which is a continuation of application No. 12/686,597, filed on Jan. 13, 2010, now Pat. No. 8,154,912, which is a continuation of application No. 12/407,762, filed on Mar. 19, 2009, now Pat. No. 7,872,903.

(51) Int. Cl.
*G11C 11/00* (2006.01)

(52) U.S. Cl.
USPC .......................................... 365/156; 365/63

(58) Field of Classification Search
USPC ............. 365/154, 156, 63, 72; 327/203, 208, 327/218
See application file for complete search history.

(56) References Cited

U.S. PATENT DOCUMENTS

| | | | |
|---|---|---|---|
| 4,852,060 A | 7/1989 | Rockett, Jr. | |
| 5,307,142 A | 4/1994 | Corbett et al. | |
| 5,504,703 A | 4/1996 | Bansal | |
| 5,631,863 A | 5/1997 | Fechner et al. | |
| 5,841,724 A * | 11/1998 | Ebel et al. | 365/226 |
| 6,275,080 B1 | 8/2001 | Phan et al. | |
| 6,696,873 B2 | 2/2004 | Hazucha et al. | |
| 6,975,041 B2 | 12/2005 | Hirano et al. | |
| 7,029,309 B2 * | 4/2006 | Ma | 439/331 |
| 7,161,404 B2 | 1/2007 | Hazucha et al. | |
| 7,233,518 B2 | 6/2007 | Liu | |
| 7,352,610 B1 | 4/2008 | Pedersen et al. | |
| 7,366,006 B2 | 4/2008 | Zhang | |

(Continued)

FOREIGN PATENT DOCUMENTS

CN 1185658 6/1998

OTHER PUBLICATIONS

Calin et al., "Upset Hardened Memory Design for Submicron CMOS Technology", IEEE Transactions on Nuclear Science, vol. 43, No. 6, Dec. 1996.

Rahim et al. U.S. Appl. No. 61/113,573, filed Nov. 11, 2008.

(Continued)

*Primary Examiner* — Gene Auduong

(74) *Attorney, Agent, or Firm* — Treyz Law Group; Jason Tsai

(57) ABSTRACT

Memory elements are provided that exhibit immunity to soft error upset events when subjected to high-energy atomic particle strikes. The memory elements may each have ten transistors including two address transistors and four transistor pairs that are interconnected to form a bistable element. Clear lines such as true and complement clear lines may be routed to positive power supply terminals and ground power supply terminals associated with certain transistor pairs. During clear operations, some or all of the transistor pairs can be selectively depowered using the clear lines. This facilitates clear operations in which logic zero values are driven through the address transistors and reduces cross-bar current surges.

21 Claims, 10 Drawing Sheets

(56) References Cited

U.S. PATENT DOCUMENTS

| | | |
|---|---|---|
| 7,759,995 B2 | 7/2010 | Ishii et al. |
| 7,768,335 B2 * | 8/2010 | Yo .................................. 327/333 |
| 7,872,903 B2 | 1/2011 | Pedersen |
| 8,154,912 B2 | 4/2012 | Pedersen |
| 2002/0130348 A1 | 9/2002 | Tran |
| 2005/0259462 A1 | 11/2005 | Wood |
| 2006/0262612 A1 | 11/2006 | Lovett |
| 2008/0087927 A1 | 4/2008 | Shin et al. |
| 2008/0180153 A1 | 7/2008 | Sachdev et al. |

OTHER PUBLICATIONS

Xu et al. U.S. Appl. No. 61/113,576, filed Nov. 11, 2008.
Rahim et al. U.S. Appl. No. 61/120,334, filed Dec. 5, 2008.
Lee et al. U.S. Appl. No. 12/391,230, filed Feb. 23, 2009.
Xu et al. U.S. Appl. No. 61/101,998, filed Oct. 1, 2008.
Rahim et al. U.S. Appl. No. 61/102,000, filed Oct. 1, 2008.
Rahim et al. U.S. Appl. No. 61/102,003, filed Oct. 1, 2008.
Casey et al., "Single-Event Tolerant Latch Using Cascode-Voltage Switch Logic Gates," IEEE Service Center, New York, NY, US, vol. 53, No. 6, Dec. 1, 2006 (6 pages).

* cited by examiner

VOLATILE MEMORY ELEMENTS WITH SOFT ERROR UPSET IMMUNITY

This application is a continuation of patent application Ser. No. 13/411,436, filed Mar. 2, 2012, which is a continuation of Ser. No. 12/686,597, filed Jan. 13, 2010, which is a continuation of patent application Ser. No. 12/407,762, filed Mar. 19, 2009, which are hereby incorporated by reference herein in their entireties. This application claims the benefit of and claims priority to patent application Ser. No. 13/411,436, filed Mar. 2, 2012, patent application Ser. No. 12/686,597, filed Jan. 13, 2010, now U.S. Pat. No. 8,154,912 and patent application Ser. No. 12/407,762, filed Mar. 19, 2009, now U.S. Pat. No. 7,872,903.

BACKGROUND

This invention relates to volatile memory elements, and more particularly, to volatile memory elements that demonstrate soft error upset immunity.

Integrated circuits often contain volatile memory elements. Typical volatile memory elements are based on cross-coupled inverters (latches). A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate nonvolatile memory elements as part of a given integrated circuit.

As a result, volatile memory elements are often used. For example, static random-access memory (SRAM) chips contain SRAM cells, which are a type of volatile memory element. Volatile memory elements are also used in programmable logic device integrated circuits.

Volatile memory elements are subject to a phenomenon known as soft error upset. Soft error upset events are caused by cosmic rays and radioactive impurities embedded in integrated circuits and their packages. Cosmic rays and radioactive impurities generate high-energy atomic particles such as neutrons and alpha particles. The memory elements contain transistors and other components that are formed from a patterned silicon substrate. When an atomic particle strikes the silicon in the memory element, electron-hole pairs are generated. The electron-hole pairs create a conduction path that can cause a charged node in the memory element to discharge and the state of the memory element to flip. If, for example, a "1" was stored in the memory element, a soft error upset event could cause the "1" to change to a "0."

Upset events in an integrated circuit corrupt the date stored in the memory elements and can have serious repercussions for system performance. In certain system applications such as remote installations of telecommunications equipment, it is extremely burdensome to repair faulty equipment. Unless programmable logic devices and other integrated circuits demonstrate good immunity to soft error upset events, they will be unsuitable for these types of applications. At the same time, care should be taken to ensure that too much circuit area is not consumed by the volatile memory elements on an integrated circuit and that the volatile memory elements exhibit good performance characteristics.

It would therefore be desirable to be able to improve the soft error upset performance of volatile memory elements in integrated circuits such as programmable logic device integrated circuits.

SUMMARY

Integrated circuits with memory elements are provided. The integrated circuits may be programmable integrated circuits, memory chips, or any other suitable integrated circuits. The memory elements may be used as static random-access memory (SRAM) or, in programmable integrated circuits, the memory cells may be used as configuration random-access memory (CRAM).

Each memory element may have a pair of address transistors and four transistor pairs. Each transistor pair may have an n-channel and a p-channel transistor connected in series at a respective output node. The output signals from the output nodes may be provided to two different transistor gates, so that the transistor pairs serve as inverter-like circuits with distributed inputs. This type of arrangement allows the memory elements to exhibit good immunity to soft error upset events.

Data write operations may be performed using complement data lines. Logic zero values may be placed on the complement data lines to write a logic one into a memory element. During these logic one write operations, logic zeros are driven through the address transistors onto the nodes of the second and fourth transistor pairs. The address transistors may be implemented using n-channel transistors that readily pass logic zero values during data write operations. Clear operations may be performed by driving logic ones onto the output nodes of the second and fourth address transistors. During these operations, the address transistors may have difficulty in passing the logic one values. To ensure that clear operations are successful, the clear lines may be used to temporarily depower (weaken) some or all of the transistor pairs during clearing. The depowered transistor pairs exhibit minimal cross-bar current, which reduces surges in clear currents in the memory array. Once the memory element has been cleared, the clear lines may be used to repower the memory element.

Further features of the invention, its nature and various advantages will be more apparent from the accompanying drawings and the following detailed description of the preferred embodiments.

DETAILED DESCRIPTION

Figure 1:
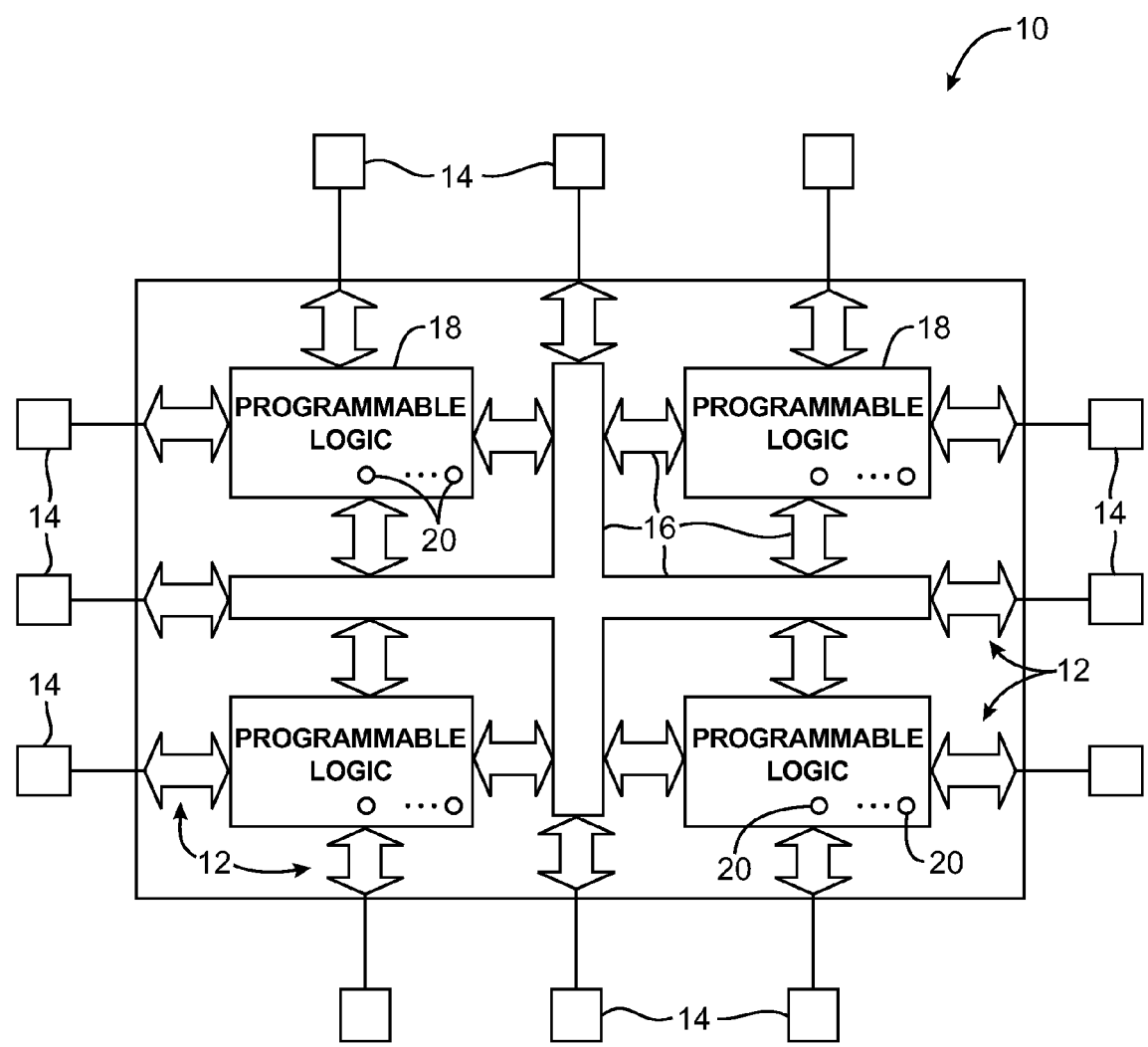
FIG. 1 is a diagram of an illustrative integrated circuit that may contain random-access memory cells in accordance with an embodiment of the present invention.

Integrated circuits often include arrays of volatile memory elements. These memory element arrays can be used to store data during data processing operations. In programmable integrated circuits such as programmable logic devices, arrays of memory elements may be loaded with configuration data that is used in configuring programmable logic circuitry. Memory cells that are used in storing configuration data for programmable integrated circuits are sometimes referred to as configuration random-access memory (CRAM) cells. Memory cells used in other types of random-access memory (RAM) arrays are sometimes referred to as RAM cells.

Memory arrays formed from CRAM cells and other RAM cells can be disrupted by radiation strikes. Disruptions of this type are known as soft error upset events. Soft error upset events are caused when high-energy atomic particles such as neutrons and alpha particles strike a portion of a memory element. Electron-hole pairs are generated when an atomic particle strikes the silicon that makes up a memory element. The electron-hole pairs can disrupt the charges on various nodes in the memory element and thereby cause the memory element to change states (e.g., to flip from a one to a zero or vice versa).

To reduce or eliminate soft error upset events and thereby improve integrated circuit reliability, memory elements can be formed that have a number of redundant interconnected inverter-like circuits. The interconnected inverter circuits can provide signals that serve as restoring feedback sources in the event of a radiation strike. Memory elements with these interconnected inverter circuits are therefore resistant to soft error upset events. Memory elements (cells) of this type may contain any suitable number of transistors. With one suitable arrangement, each memory element may contain ten transistors.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the present invention may sometimes be described in the context of programmable logic device integrated circuits. This is, however, merely illustrative. Memory cells in accordance with embodiments of the present invention may be used in any suitable circuits. On integrated circuits such as memory chips or other circuits in which memory is needed to store processing data, the memory elements may perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

An illustrative integrated circuit 10 such as a programmable logic device or other programmable integrated circuit with memory is shown in FIG. 1.

Device 10 may have input/output circuitry 12 for driving signals off of device 10 and for receiving signals from other devices via input/output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources may be considered to be a part of programmable logic 18.

Programmable logic device 10 contains volatile memory elements 20 that can be loaded with configuration data (also called programming data) using pins 14 and input/output circuitry 12. Once loaded, the memory elements each provide a corresponding static control output signal that controls the state of an associated logic component in programmable logic 18. If desired, memory elements 20 may be used in SRAM-type memory arrays (e.g., to store data for processing circuitry during operation of device 10).

Each memory element 20 may be formed from a number of transistors configured to form a bistable circuit. With one suitable approach, complementary metal-oxide-semiconductor (CMOS) integrated circuit technology is used to form the memory elements 20, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 12. Loaded CRAM memory elements 20 may provide static control signals that are applied to the terminals (e.g., gates) of circuit elements (e.g., metal-oxide-semiconductor transistors) in programmable logic 18 to control those elements (e.g., to turn certain transistors on or off) and thereby configure the logic in programmable logic 18. The circuit elements may be transistors such as pass transistors, parts of multiplexers, look-up tables, logic arrays, AND, OR, NAND, and NOR logic gates, etc.

The memory elements 20 may be arranged in an array pattern. In a typical modern programmable logic device, there may be millions of memory elements 20 on each chip. During programming operations, the array of memory elements is provided with configuration data by a user (e.g., a logic designer). Once loaded with configuration data, the memory elements 20 selectively control portions of the circuitry in the programmable logic 18 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

When memory elements 20 are arranged in an array, horizontal and vertical conductors and associated control circuitry may be used to access the memory elements. The control circuitry may, for example, be used to clear all or some of the memory elements. The control circuitry may also write data into the memory elements and may read data from the memory elements. For example, in CRAM arrays, memory elements may be loaded with configuration data. Loaded configuration data may then be read out from the array to confirm proper data loading operations before device 10 is used during normal operation in a system.

Figure 2:
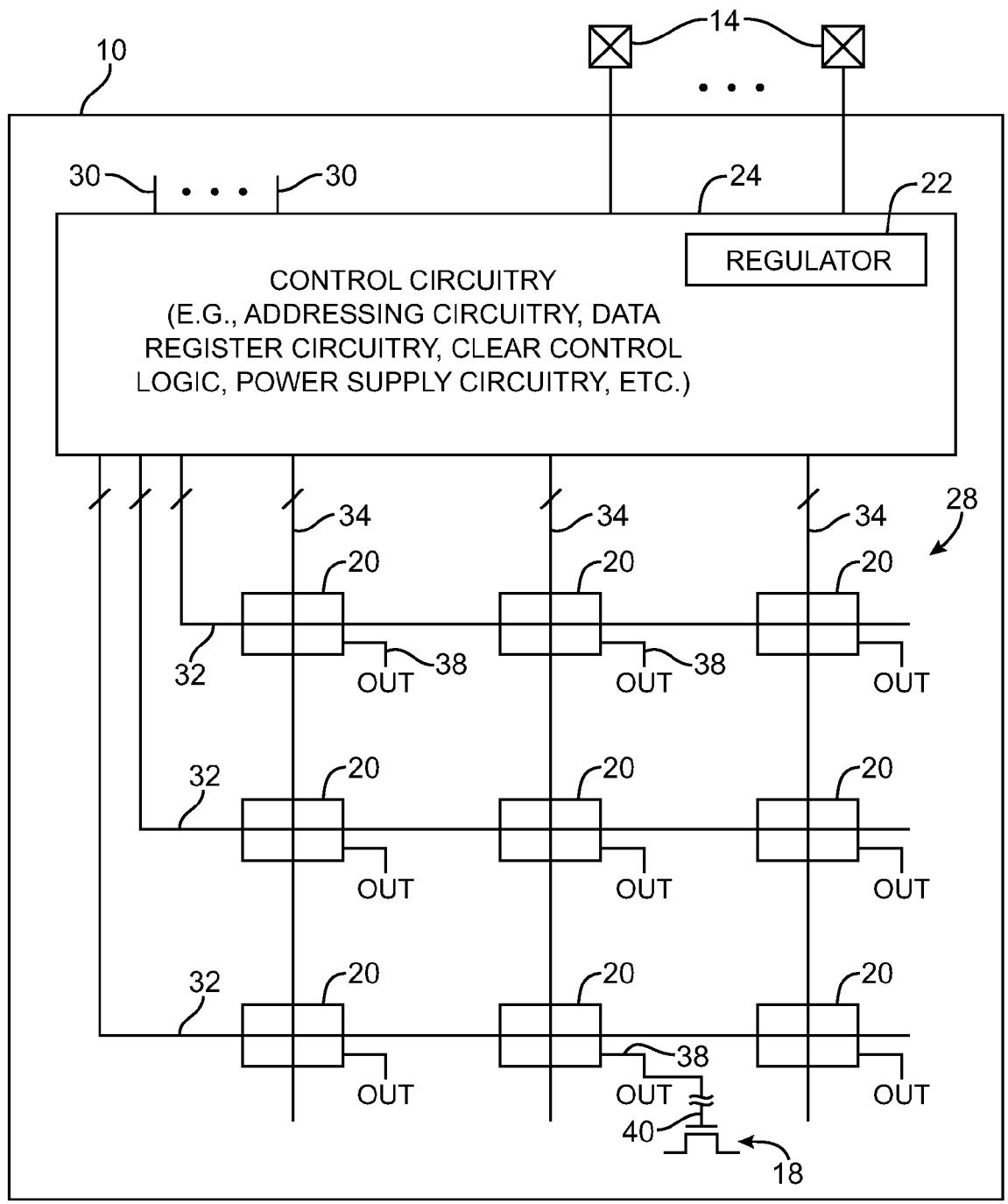
FIG. 2 is a diagram of an illustrative array of memory cells in accordance with an embodiment of the present invention.

Any suitable memory array architecture may be used for memory elements 20. One suitable arrangement is shown in FIG. 2. As shown in FIG. 2, there may be an array 28 of memory elements 20 in device 10. There are only three rows and columns of elements 20 in the illustrative array of FIG. 2, but in general there may be hundreds or thousands of rows and columns in array 28. Array 28 may be one of a number of arrays on a given device 10, may be a subarray that is part of a larger array, or may be any other suitable group of memory elements 20. Each memory element may supply a corresponding output signal OUT at a corresponding output path 38. In CRAM arrays, each signal OUT is a static output control signal that may be conveyed over a path 40 and used in configuring a corresponding transistor such as transistor 18 or other circuit element in associated programmable logic 18.

Integrated circuit 10 may have control circuitry 24 for supplying signals to memory elements 20 in memory array 28. Control circuitry 24 may receive power supply voltages, data, and other signals from external sources using pins 14 and from internal sources using paths such as paths 30. Control circuitry 24 may include circuitry such as an adjustable voltage supply (regulator 22), address decoder circuitry, address register circuitry, data register circuitry, and clear control circuitry. Regulator 22 may be used to produce time-varying power supply voltages. These power supply voltages may be of the same magnitude as the voltages received on pins 14 or may have different magnitudes than the voltage received from pins 14. Control circuitry 24 (e.g., the addressing circuitry, data register circuitry, clear control circuitry, and other control circuitry of circuitry 24) can use the power supply voltages supplied by pins 14 and by regulator 22 to produce desired time-varying and fixed signals on paths such as paths 32 and 34.

There may, in general, be any suitable number of conductive lines associated with paths 32 and 34. For example, each row of array 28 may have a single associated address line in a respective one of paths 32 that carries a corresponding address signal ADDR (as an example). Each column of array 28 may have a respective path 34 in which a corresponding data line (i.e., a complementary data line) is used to receive a complementary data signal NDATA. A clear signal such as a complementary clear signal NCLR may be routed to all of the cells in array 28 simultaneously over a common clear line. The clear line may be oriented horizontally so that there is one branch of the clear line in each path 32 or may be oriented vertically so that there is one branch of the clear line in each path 34. Power can also be distributed in this type of global fashion. For example, a positive power supply voltage (sometimes referred to as Vcc) may be supplied in parallel to each cell 20 using a pattern of shared horizontal or vertical conductors. A ground voltage Vss may likewise be supplied in parallel to the cells 20 using a pattern of shared horizontal or vertical lines. Address lines and data lines are typically orthogonal to each other (i.e., address lines are horizontal while data lines are vertical or vice versa).

If desired, other patterns of lines may be used in paths 32 and 34. For example, both true and complement clear signals (CLR and NCLR) can be routed into array 28 using parallel sets of lines. Similarly, different numbers of power supply signals, data signals, and address signals may be used.

The signals that are supplied to memory elements 20 may sometimes be collectively referred to as control signals. In particular contexts, some of these signals may be referred to as power signals, clear signals, data signals, address signals, etc. These different signal types are not mutually exclusive. For example, a clear signal for array 28 serves as a type of control signal that can be used to clear array 28. This clear signal also serves as a type of power signal by powering inverter-like circuitry in cells 20. Likewise, because clearing operations serve to place logic zeros in memory cells 20, clear signals may serve as a type of data signal.

Any suitable values may be used for positive power supply voltage Vcc and ground voltage Vss. For example, positive power supply voltage Vcc may be 1.2 volts, 1.1 volts, 1.0 volts, 0.9 volts, or any other suitable voltage. Ground voltage Vss may be, for example, 0 volts. In a typical arrangement, power supply voltages Vcc may be 1.0 volts, Vss may be 0 volts, and the signal levels for address, data, and clear signals may range from 0 volts (when low) to 1.0 volts (when high).

Sometimes performance can be enhanced by temporarily raising or lowering these voltage levels from their nominal value. For example, it may be desirable to temporarily lower a Vcc value to weaken all or part of a cell 20 during data writing operations or it may be desirable to temporarily elevate a Vcc value to strengthen all or part of a cell during data read operations. During normal operation, it may be desirable to elevate the power supply voltage for cells 20, as this may correspondingly elevate the value of the output voltage (signal OUT) on the output lines 38 that are associated with cells 20 (i.e., for those cells that are loaded with a logic one). The static output signals that are provided at the output of each CRAM cell can be applied to the gate of a metal-oxide-semiconductor transistor over a corresponding control line (e.g., control line 40 in FIG. 2). This elevated output signal may, in turn, help to fully turn on a corresponding transistor in programmable logic 18, improving circuit performance.

If desired, elevated logic high voltages and/or reduced ground voltages can be used for data signals, clear signals, and address signals. Whether associated with temporarily altered power supply voltages or temporarily elevated signal strengths for other control signals, these time-varying signal strength enhancement schemes are sometimes referred to as overdrive schemes. These schemes may be used in any suitable combination. As just one example, address signal ADDR may be overdriven (e.g., to an elevated voltage of 1.2 volts) during addressing operations for reads and writes with array 28. Overdriving ADDR in this way may help to fully turn on the address transistors in array 28, improving performance. In the same array 28 that uses an overdriven address signal, the positive power supply voltage Vcc (or a clear signal used as a power supply voltage) that is supplied to cells 20 may be temporarily reduced in power during data write operations to enhance write margin (e.g., to 0.9 volts). This power supply voltage (or the clear signal) can then be taken to a larger value during normal operation (e.g., 1.4 volts), to increase the magnitude of signal OUT (for those cells that contain logic ones).

In general, any suitable arrangement may be used for varying signal strengths for array 28 (e.g., time varying power supply levels, temporarily overdrive address signal levels, etc.). These optional signal strength modifications may take place during clear operations in which array 28 is being cleared, during write operations in which data is being written into array 28, during read operations in which data is being read out from array 28, and during normal operation in which signals OUT from a loaded array are being applied to corresponding programmable logic 18.

When using these schemes, the magnitudes of true and complement data signals, true and complement clear signals, and power supply signals such as Vcc and Vss can changed as a function of time in addition to the normal time variations that these signals experience when transitioning from their logic high to logic low values. Signal magnitude variations can be imposed on both logic high signals (e.g., by temporarily reducing a logic high value from 0.9 volts to 0.7 volts) and logic low signals (e.g., by temporarily reducing a logic low value from 0 volts to −0.2 volts). Combinations of positive voltage variations and ground voltage variations may also be made if desired.

Circuitry 24 may control clearing operations, data loading operations, and read operations for array 28.

In preparation for data loading operations, circuitry 24 may clear array 28. The clear operation takes the contents of each memory cell 20 to a known value (i.e., to a logic zero). Once cleared, each OUT signal will be low (i.e., Vss). Circuitry 24 may produce clear signals such as a complementary clear signal NCLR and/or a true clear signal CLR that are used in clearing operations. When clearing a CRAM array, all clear lines of a given type (e.g., all complementary clear lines in an array that is cleared using only complementary clear lines) may be commonly controlled. In this way, the clear signals may be asserted and deasserted simultaneously for all cells in the array. This type of global clear operation can help to reduce clear times. If desired, clear signals can be asserted individually for different groups of cells. Clearing operations for CRAM arrays are typically performed upon system power-up or during reconfiguration.

After array 28 has been cleared, circuitry 24 may load data into array 28. Circuitry 24 may receive data such as configuration data from external sources via input path 30. In a typical programmable logic device system, configuration data is loaded into a programmable logic device from a memory and data loading circuit. This type of circuit, which is sometimes referred to as a configuration device, loads configuration data into registers within circuitry 24. Address decoder circuits in circuitry 24 may receive external control signals or addressing control signals can be generated internally in circuitry 24. Address signals can be controlled independently in each row (or in column-based addressing schemes, in each column).

Configuration data may be loaded into registers in circuitry 24 in series. These registers may then apply the configuration data in parallel to array 28 via data lines (e.g., true data lines, complementary data lines, or both true and complementary data lines). Address decoder circuitry in circuitry 24 can receive addressing information via input 30. The address decoder circuitry can then systematically assert desired address lines 32. As the address line in each row is asserted (i.e., as the signal ADD in a given row is taken high), the data on the data lines 34 is loaded into the memory elements 20 in that column. By addressing each row in this way, the entire array 28 may be loaded with configuration data. After the array has been loaded, the output 38 of each memory element 20 produces a corresponding static control signal for controlling the gate of a pass transistor or other logic component in the programmable logic 18 of the programmable logic device 10 (FIG. 1).

Control circuitry 24 may perform data read operations on array 28 to confirm that data has been loaded properly. Data reading operations may be performed by systematically asserting desired address lines and monitoring the resulting data on data lines (e.g., using sense amplifier circuitry in circuitry 24).

Figure 3:
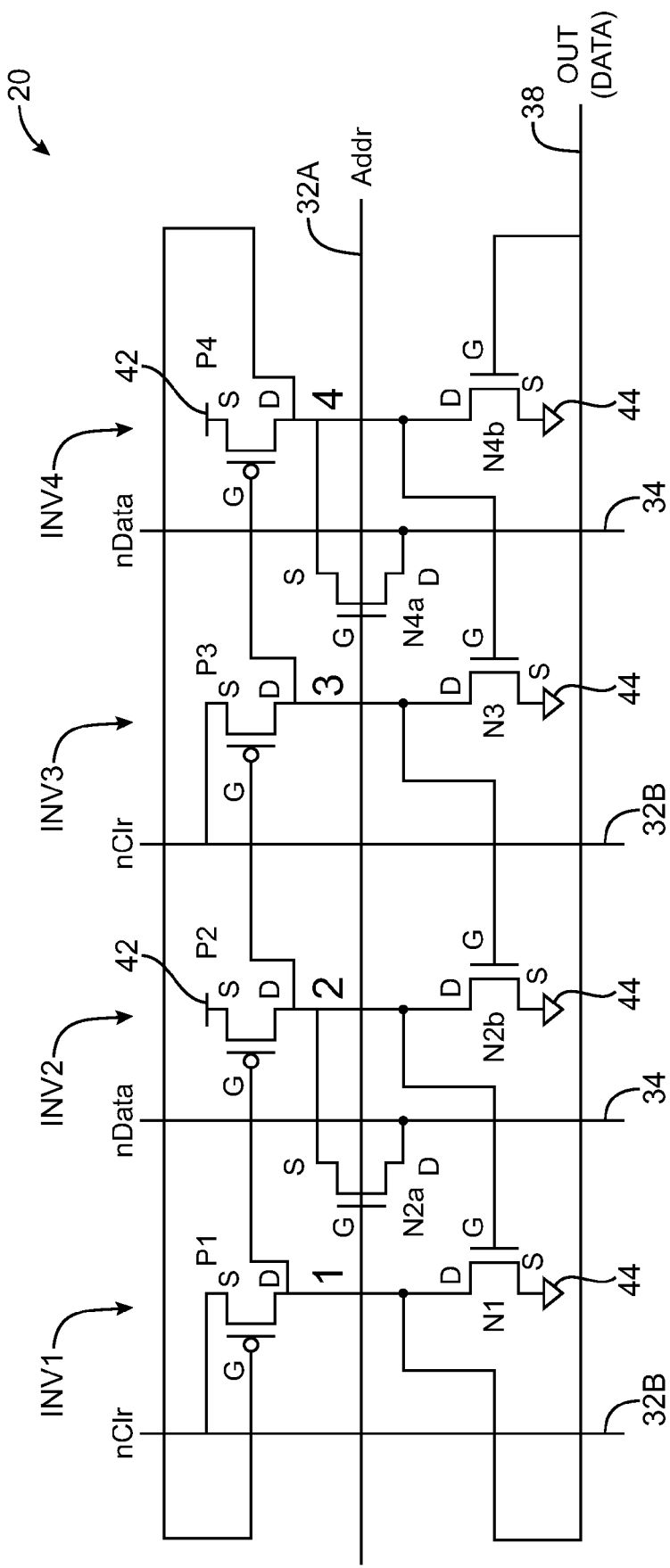
FIG. 3 is a diagram of an illustrative memory cell in accordance with an embodiment of the present invention.

A memory element 20 of the type that may be used in array 28 of FIG. 2 is shown in FIG. 3. As shown in FIG. 3, memory element 20 may have a ten transistor (10T) configuration and may include p-channel metal-oxide-semiconductor (PMOS) transistors P1, P2, P3, and P4 and re-channel metal-oxide-semiconductor (NMOS) transistors N1, N2A, N2B, N3, N4A, and N4B. The gates of these transistors are labeled "G." The sources S and the drains D are also labeled. The source and drain terminals of the transistors in element 20 are sometimes collectively referred to as source-drain terminals.

Data can be conveyed over data lines such as complement data lines 34 (i.e., in the form of complement data signals NDATA). An associated address line such as address line 32A may be used to convey address signal ADDR to the gates of address transistors N2A and N4A. Clear lines such as complement clear lines 32B may be used to provide memory element 20 with clear signals (i.e., complement clear signal NCLR). A positive power supply signal (e.g., Vcc) may be applied to positive power supply terminals 42. A ground power supply signal (e.g., Vss) may be applied to ground terminals 44.

There are four labeled nodes in memory element 20 of FIG. 3: 1, 2, 3, and 4. Any of these nodes may be used as output 38 of FIG. 2. For example, node 1 may be connected to output 38 of FIG. 2, as shown in the example of FIG. 3. Multiple outputs may also be tapped from two or more of the nodes in a single cell if desired.

Memory element 20 exhibits bistable operation. When memory element 20 has been loaded with a "1," the values of 1, 2, 3, and 4 will be "1,", "0," "1," and "0," respectively. When memory element has been loaded with a "0," the values of 1, 2, 3, and 4 will be "0,", "1," "0," and "1," respectively.

Unlike conventional memory element designs that are based on a pair of cross-coupled inverters, memory element 20 of FIG. 3 has four inverter-like pairs of transistors (sometimes referred to as "inverters") that are connected in a ring to form a bistable memory element. A first pair of transistors (P1 and N1) forms inverter-like circuit INV1 and is associated with output node 1. A second pair of transistors (P2 and N2B) forms inverter-like circuit INV2 and is associated with output node 2. Likewise, a third pair of transistors (P3 and N3) forms inverter-like circuit INV3 having node 3, whereas a fourth pair of transistors (P4 and N4B) forms inverter-like circuit INV4 having node 4.

In conventional cross-coupled inverter designs, there is a relatively strong likelihood that a radiation strike on an inverter's input node will cause the inverter's output to change states, thereby flipping the state of the cell to an erroneous value.

The FIG. 3 layout uses four interlocked inverter circuits to produce a stable cell that exhibits good immunity to soft error upset events. In the arrangement of FIG. 3, the gate of the p-channel transistor in each transistor pair receives its input from a different output node than the gate of the n-channel transistor in the same transistor pair. For example, node 1, which is located between the drain D of transistor P1 and the drain D of transistor N1 in inverter INV1 produces a control signal that is passed to the gate G of transistor N4B in inverter INV4. The gate G of the other transistor in inverter INV4 (i.e., the gate G of transistor P4) receives a control signal from a different inverter. In particular, gate G of transistor P4 receives a gate control signal from node 3 in inverter INV3. Similarly, the gate control signals for the transistors in inverter INV1 are received from nodes 2 and 4, gate inputs for the transistors in inverter INV2 are received from nodes 1 and 3, and the gate inputs for the transistors in inverter INV3 are received from nodes 2 and 4. Because the control signals for the transistor gates of each inverter are received from the outputs of two different inverters, the control signals are distributed between inverters and are less dependent on the stability of any given inverter. With the control signals distributed in this way, memory cell 20 is better able to recover from a radiation strike on a particular node (i.e., one of the four inverters) without flipping its state than conventional memory elements based on a pair of cross-coupled inverters.

The ten-transistor configuration of memory element 20 of FIG. 3 provides good stability and resistance to undesired upsets from radiation strikes. Nodes 2 and 4 can be accessed for data write and read operations using address transistors N2A and N4A. The address transistors in memory element 20 may, in general, be n-channel metal-oxide-semiconductor transistors, p-channel metal-oxide-semiconductor transistors, or may include both n-channel and p-channel transistors. In the illustrative arrangement of FIG. 3, address transistors N2A and N4A are n-channel transistors. When driving signals through an n-channel transistor (i.e., from source to drain), low voltages (i.e., logic zeros at Vss) are more effectively passed than high voltages (i.e., logic ones at Vcc). This is because re-channel address transistors are more fully turned on when NDATA is low and ADDR is high than when NDATA is high and ADDR is high. As a result, DATA "1" values can effectively be loaded through address transistors N2A and N4A while circuits INV1, INV2, INV3, and INV4 are all powered normally. But DATA "0" values can generally only be placed in memory element 20, by performing a clear operation in which the NCLR lines 32B are used in selectively depowering part of the memory element.

Consider a scenario in which it is desired to use address transistors N2A and N4A to load a logic one into memory element 20. To load a logic one value, complement data signals NDATA are held low at Vss on lines 34. Address signal ADDR on line 32A is taken high. When asserting ADDR in this way, the gates G of address transistors N2A and N4A are held at Vcc while the drains D of address transistors N2A and N4A are held at Vss by lines 34. In this situation, address transistors N2A and N4A will turn on and will pull their source terminals S to Vss. This pulls nodes 2 and 4 low. Because of the feedback provided by the interconnected gates of memory element 20, pulling nodes 2 and 4 low will drive nodes 1 and 3 high to Vcc. Once nodes 2 and 4 are low and nodes 1 and 3 are high, memory element 20 will be in a stable state storing a logic one and memory address line 32A may be deasserted. When storing a logic one value for DATA, output signal OUT on line 38 will be high.

Driving NDATA lines 34 to Vcc is not typically sufficient to clear memory element 20, because logic one values are not passed strongly enough through n-channel address transistors N2A and N4A. If desired, one or more additional address transistors could be added to memory element 20 to directly address nodes 1 and 3. Adding such address transistors would, however, increase the area consumed by each memory element 20. Therefore, memory element 20 is preferably provided with only two address transistors (transistors N2A and N4A). The challenges faced by address transistors N2A and N4A in placing a logic zero in memory element 20 by taking NDATA high can be overcome by tying the sources S of transistors P1 and P3 to NCLR lines 32B as shown in the illustrative layout of FIG. 3.

With this type of arrangement, clear control signal NCLR can be used in clearing all memory elements 20 in array 28 simultaneously. Because the sources S of transistors P1 and P3 are tied to NCLR, current surges through transistors P1 and P3 (and therefore through inverter circuits INV1 and INV3) can be avoided by holding NCLR low during clear operations. Reduced currents of this type, which are sometimes referred to as cross-bar currents, help to reduce the need for large power supplies and large signal distribution lines on integrated circuit 10, thereby helping to reduce cost and complexity for circuit 10.

Even though memory element 20 does not have address transistors connected to nodes 1 and 3, nodes 1 and 3 can be taken low to clear memory element 20 during clear operations by holding NCLR at Vss while asserting address signal ADDR (i.e., to a normal Vcc level or an elevated power supply voltage). During clear operations, the low voltages on complement clear control signal NCLR depower inverter-like circuits INV1 and INV3, which makes the state change easier (flipping DATA from high to low).

Figure 4:
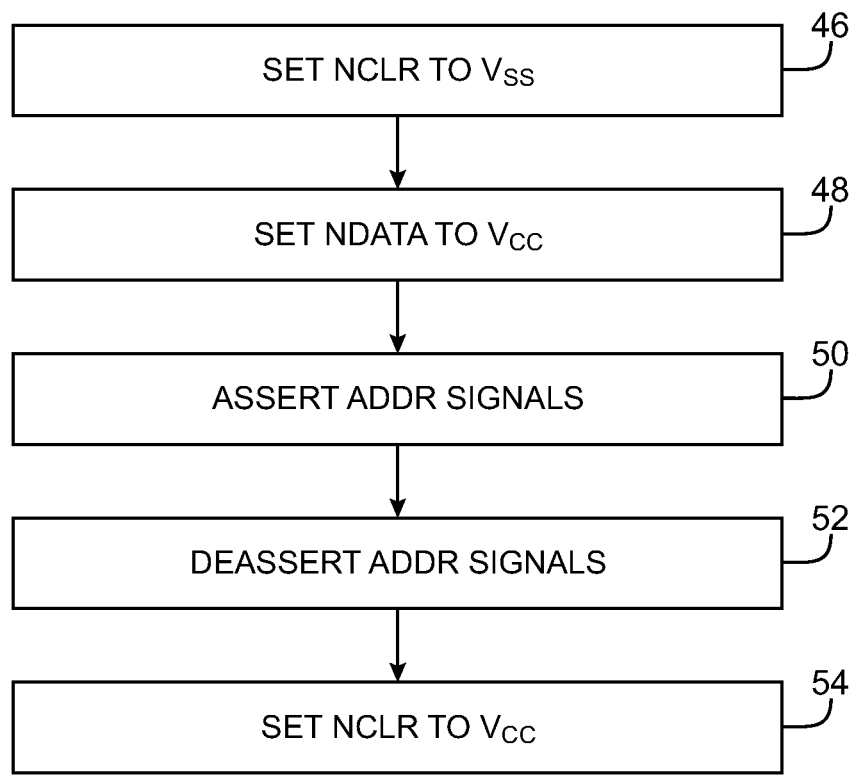
FIG. 4 is a flow chart of illustrative steps involved in clearing an array of memory cells of the type shown in FIG. 3 in accordance with an embodiment of the present invention.

Illustrative operations involved in clearing an array 28 of memory elements 20 of the type shown in FIG. 3 are shown in FIG. 4.

At step 46, control circuitry 24 (FIG. 2) can take NCLR to Vss. This operation can be performed globally, using a set of distribution lines that are tied to a common output node for circuitry 24 (i.e., a common NCLR line). Taking NCLR low pulls nodes 1 and 3 towards Vss (i.e., this operation pulls nodes 1 and 3 low).

At step 48, control circuitry 24 can take signal NDATA high. This takes the drains D of address transistors N2A and N4A high. NDATA can be taken high in all columns for which clearing is desired (e.g., for all columns in array 28).

At step 50, control circuitry 24 can assert signal ADDR for all rows for which clearing is desired (e.g., for one or more rows in array 28). Address signal ADDR can be asserted by taking ADDR to a normal positive power supply level such as the level used for data signals in normal programmable logic or other circuitry on integrated circuit (e.g., a nominal Vcc value) or can be overdriven to an elevated value. For example, if the nominal power supply voltage Vcc on device 10 is 0.9 volts, ADDR can be set to 0.9 volts or a higher value such as 1.1 volts (as an example).

When ADDR is asserted, the gates G of address transistors N2A and N4A are taken high. This turns on address transistors N2A and N4A. When transistors N2A and N4A are turned on, drains D of transistors N2A and N4A are shorted to respective sources S of transistors N2A and N4A. As a result, nodes 2 and 4 are pulled high towards the high NDATA voltage level. Because circuits INV1 and INV3 are depowered, transistors N1 and N3 are turned on as nodes 2 and 4 go high, holding nodes 1 and 3 firmly at Vss. In this situation, the gates of transistors P2 and P4, which receive control signals from nodes 1 and 3, respectively, are low and transistors P2 and P4 are fully on, pulling complementary data nodes 2 and 4 high. The address signal ADDR may then be deasserted (step 52) and inverters INV1 and INV3 can be repowered by returning NCLR to Vcc (step 54). The NDATA signals can be maintained at Vcc. As inverter-like circuits INV1 and INV3 are powered, the high value of node 4 holds transistor P1 off, so that node 1 remains low. Similarly, the high value of node 2 holds transistor P3 off, so that node 3 remains low. Following step 54, each memory element 20 is in a stable state with DATA equal to zero (i.e., nodes 2 and 4 are high and nodes 1 and 3 are low). All memory elements 20 in array 28 have therefore been cleared.

After array 28 has been cleared so that the memory elements 20 in array 28 each contain a logic zero, array 28 may be loaded with configuration data or other suitable data values. In particular, data write operations may be performed in which logic one values are written into the array at desired locations. During data write operations, appropriate signals NDATA are held low. These low values pass through the address transistors of addressed cells 20 and serve to pull complementary data nodes 2 and 4 low. Once loading is complete, each cell into which a low NDATA value was loaded will be loaded with a logic one.

Figure 5:
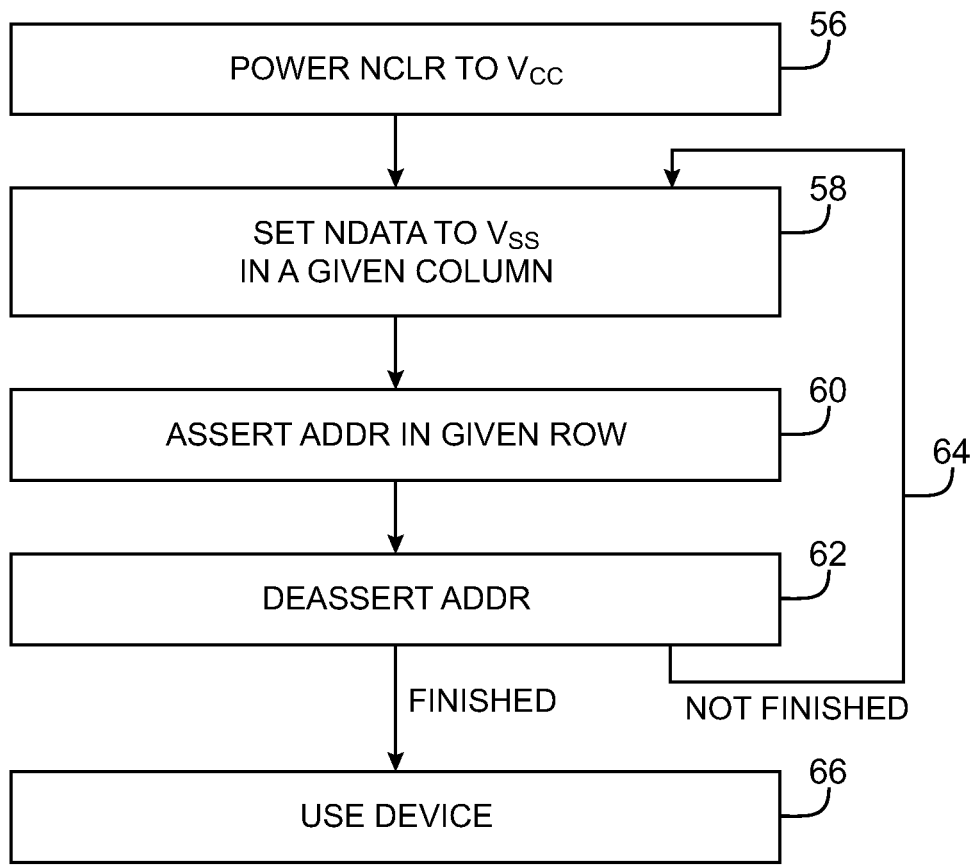
FIG. 5 is a flow chart of illustrative steps involved with writing data into an array of cleared memory cells of the type shown in FIG. 3 in accordance with an embodiment of the present invention.

Illustrative steps involved in writing logic ones into an array 28 of memory elements 20 of the type shown in FIG. 3 are shown in FIG. 5.

Initially, memory elements 20 in array 28 may be provided with high NCLR values (step 56) as during normal operation of array 28. A global distribution path (i.e., a path in which all clear control signal distribution lines are tied to a common node) can be used in distributing the NCLR values to all of the memory elements in array 28 in parallel. With NCLR high (e.g., at Vcc), inverter-like circuits INV1 and INV3 will be powered in each memory element. Inverter-like circuits INV2 and INV4 are powered using the positive power supply voltage (e.g., Vcc) that is applied to power supply terminal 42.

At step 58, control circuit 24 may take complement data signals NDATA low for certain columns in array 28 to prepare for the loading of data one values into the cells of an addressed row of array 28. The state of NDATA in each column may be determined by the output of a data register in control circuitry 24. Using this approach, the values of NDATA may be high for some columns of array 28 and may be low for other columns of array 28. In general, any suitable number of NDATA signals may be held low. Arrangements in which control circuit 24 holds NDATA low for more than one column at the same time allow data one values to be written into multiple memory elements 20 in parallel.

At step 60, control circuit 24 can take the address signal ADDR high in a given row of array 28. The address transistors N2A and N4A in those memory elements 20 for which NDATA is low are therefore turned on. In these memory elements 20, the sources S of the address transistors are shorted to their drains D, pulling nodes 2 and 4 low. When nodes 2 and 4 are pulled low in this way, transistor P1 in circuit INV1 will be turned on and transistor N1 will be turned off, taking node 1 high, whereas transistor P3 in circuit INV3 will be similarly turned on and transistor N3 will be turned off, taking node 3 high. The address signal ADDR in the given row can then be deasserted (e.g., taken low) at step 62.

As a result of these operations, all memory elements 20 corresponding to low NDATA signals in the row in which ADDR was asserted will be loaded with logic ones. The memory elements in the same row that correspond to high NDATA signals will remain cleared (loaded with logic zeros).

If more rows in array 28 remain to be loaded with logic ones, processing can loop back to step 58, as indicated by line 64. If all desired memory elements 20 in array 28 have been loaded, data write operations are complete and integrated circuit 10 can be used in a system (step 66). In situations in which integrated circuit 10 is a programmable integrated circuit and in which memory array 28 is loaded with configuration data, each loaded memory element 20 may provide a corresponding static output control signal that configures a transistor or other component in programmable logic 18. During the operations of step 66, the programmable logic that has been customized in this way may be used to process system signals.

Cross-bar current surges during clear operations can be further reduced by momentarily depowering inverter-like circuits INV2 and INV4 in addition to depowering inverter-like circuits INV1 and INV3. An illustrative memory element 20 that includes true clear control lines 32C for selectively depowering inverters INV2 and INV4 during clear operations to help further reduce current surges in this way is shown in FIG. 6.

Figure 6:
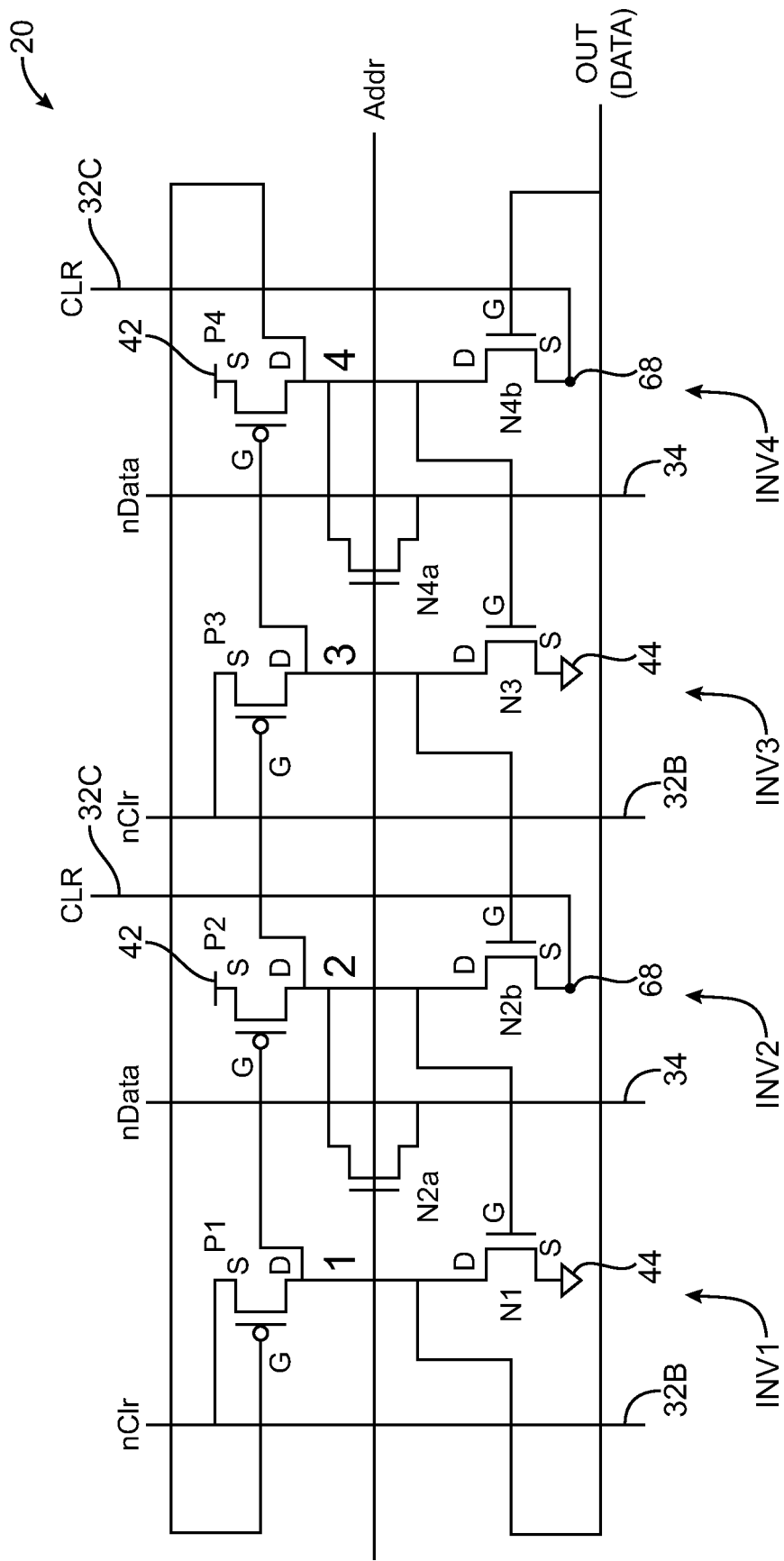
FIG. 6 is a diagram of an illustrative memory cell having true and complement clear lines in accordance with an embodiment of the present invention.

As shown in FIG. 6, memory element 20 may have interconnected inverter-like circuits INV1, INV2, INV3, and INV4 of the type shown in FIG. 3. Circuits INV1 and INV3 of FIG. 6 may be powered by the complement clear control signal NCLR on path 32B and the ground signal Vss on ground terminals 44, as with circuits INV1 and INV3 of FIG. 3. Circuits INV2 and INV4 of FIG. 6 may be powered using a positive power supply (e.g., Vcc) on terminals 42 and true clear control signal CLR on path 32C and terminals 68. In this type of configuration, the complement clear control signal NCLR serves as a controllable positive power supply voltage that can be used to selectively power and depower inverter-like circuits INV1 and INV3. The true clear control signal CLR serves as a controllable ground power supply signal that can be used to selectively power and depower inverter-like circuits INV2 and INV4.

Figure 7:
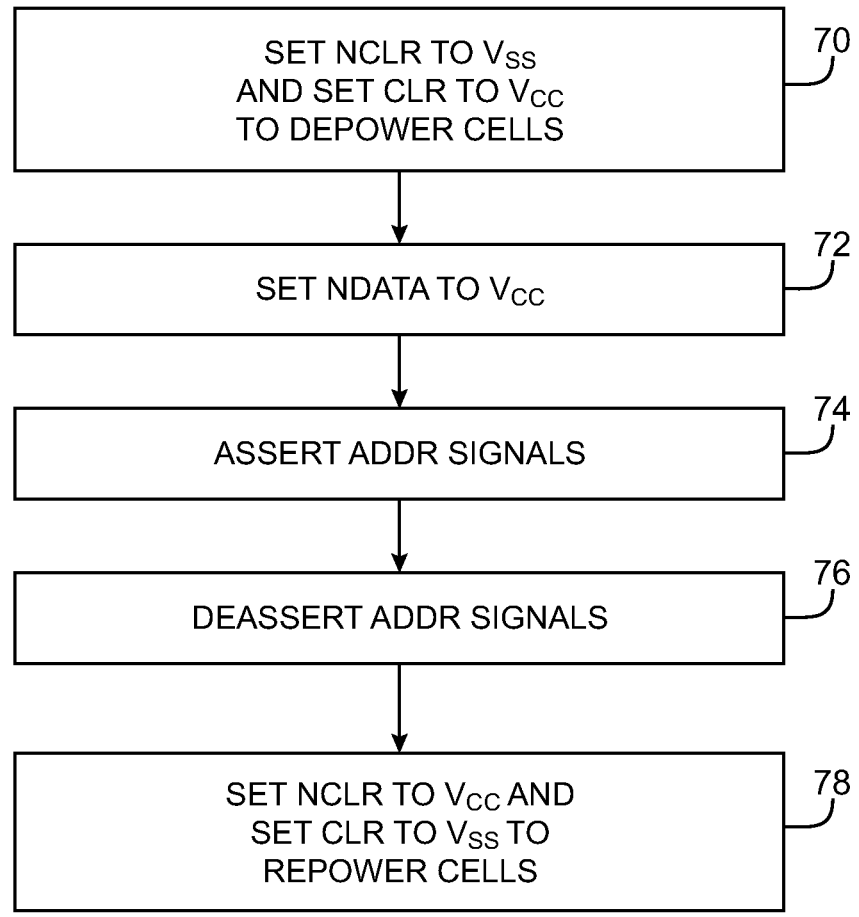
FIG. 7 is a flow chart of illustrative steps involved in clearing an array of memory cells of the type shown in FIG. 6 in accordance with an embodiment of the present invention.

Illustrative operations involved in clearing an array 28 of memory elements 20 of the type shown in FIG. 6 are shown in FIG. 7.

At step 70, control circuitry 24 of FIG. 2 can take NCLR to Vss and can take CLR to Vcc. This temporarily depowers circuits INV1, INV2, INV3, and INV4. The operations of step 70 may be performed globally. In particular, a global distribution network may be used to distribute signal NCLR to all memory elements 20 in array 28 in parallel. Similarly, a global distribution network may be used to distribute signal CLR to all memory elements 20 in array 28 in parallel. Taking NCLR low pulls nodes 1 and 3 towards Vss (i.e., this operation pulls nodes 1 and 3 low), whereas taking CLR high pulls nodes 2 and 4 towards Vcc (i.e., this operation pulls nodes 2 and 4 high).

At step 72, control circuitry 24 can take signal NDATA high in all columns for which clearing is desired (e.g., for all columns in array 28). This takes the drains D of address transistors N2A and N4A high.

At step 74, control circuitry 24 can assert signal ADDR for all rows for which clearing is desired (e.g., for all rows in array 28). As with the clearing operations of FIG. 4, all rows in array 28 can be simultaneously cleared or a subset of the rows in array 28 can be simultaneously cleared (e.g., one row at a time or in groups).

During step 74, signal ADDR can be asserted by taking ADDR to a normal positive power supply level such a the level used for normal programmable logic or other circuitry on integrated circuit 10 (e.g., a nominal Vcc value) or can be overdriven to an elevated value. For example, if the nominal power supply voltage Vcc on device 10 is 0.9 volts, ADDR can be set to 0.9 volts or a higher value such as 1.1 volts (as an example).

When ADDR is asserted, the gates G of address transistors N2A and N4A are taken high, turning on address transistors N2A and N4A. This shorts the drains D of transistors N2A and N4A to the respective sources S of transistors N2A and N4A. Nodes 2 and 4 are therefore pulled high to the high NDATA voltage level. Transistors N1 and N3 are turned on as nodes 2 and 4 are pulled high, shorting nodes 1 and 3 to Vss on ground terminals 44. The gates of transistors P2 and P4 receive respective control signals from nodes 1 and 3 and are therefore taken low. The low gate voltages for transistors P2 and P4 turn transistors P2 and P4 on and short nodes 2 and 4 to positive power supply terminals 42, pulling nodes 2 and 4 high. In this situation, nodes 1 and 3 are low and nodes 2 and 4 are high (i.e., the memory cells have all been cleared).

The clear operations involve negligible amounts of crossbar current, because NCLR, which served as the positive power supply voltage for inverters INV1 and INV3 was low during the clear operation, and because CLR, which served as the ground power supply voltage for inverters INV2 and INV4 was high during the clear operation. Eliminating current surges during clear operations helps to reduce the current handling requirements of circuitry such as circuitry 24 of FIG. 2 and thereby helps minimize the cost and complexity of circuitry 24. There is generally less current during the clear operations of FIG. 7 than during the clear operations of FIG. 4, because in the FIG. 7 arrangement both sets of inverter-like circuits (i.e., both INV1/INV3 and INV2/INV4) are prevented from drawing significant cross-bar current during clearing, whereas in the FIG. 4 arrangement only the INV1/INV3 circuits were blocked from drawing current.

After memory elements 20 have been cleared, the clear operations of FIG. 7 can be completed by deasserting address signal ADDR (step 76) and by returning memory elements 20 to their normal powered state. In particular, during the operations of step 78, inverter-like circuits INV1 and INV3 can be repowered by returning NCLR to Vcc and inverter-like circuits INV2 and INV4 can be repowered by returning CLR to Vss. Following step 78, each memory element 20 is in a stable state with DATA equal to zero (i.e., nodes 2 and 4 are high and nodes 1 and 3 are low). All memory elements 20 in array 28 have therefore been cleared.

After array 28 has been cleared, array 28 may be loaded with configuration data or other suitable data. In particular, data write operations may be performed in which logic ones are written into array 28 at desired locations. When writing a logic one into a memory element, the signals NDATA for that memory element are held low. These low values pass through the address transistors of the memory element 20 and serve to pull complementary data nodes 2 and 4 low for that memory element. The low values of nodes 2 and 4, in turn, pull nodes 1 and 3 high, completing the loading of the data one value.

Figure 8:
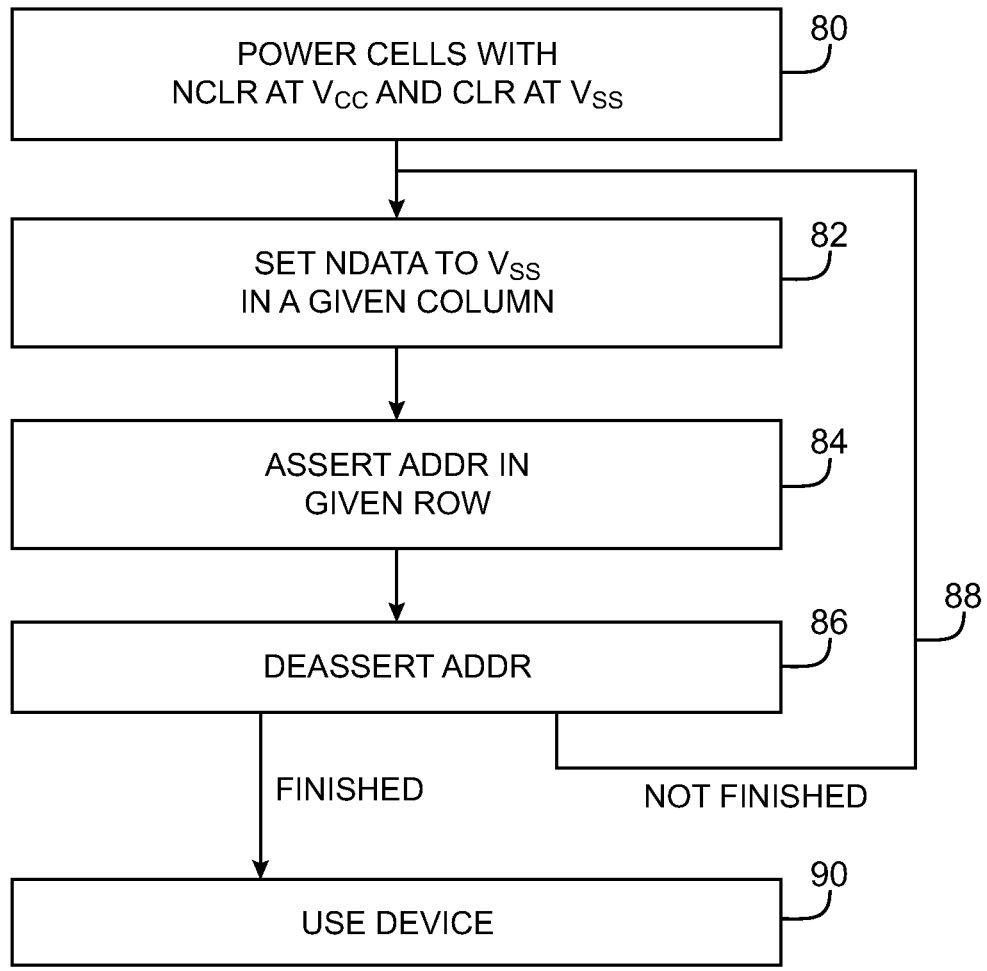
FIG. 8 is a flow chart of illustrative steps involved with writing data into an array of cleared memory cells of the type shown in FIG. 6 in accordance with an embodiment of the present invention.

Illustrative steps involved in writing logic ones into an array 28 of memory elements 20 of the type shown in FIG. 6 are shown in FIG. 8.

Memory elements 20 in array 28 are initially provided with high NCLR values and low CLR values by control circuit 24 as during normal operation of array 28 (step 80). Global distribution paths may be used in distributing signals CLR and NCLR. For example, a global true clear control signal distribution path may be used to globally distribute true clear control signal CLR to all memory elements 20 in parallel and a global complement clear control signal distribution path may be used to globally distribute complement control signal CLR to all memory elements 20 in parallel. With NCLR high and CLR low, inverter-like circuits INV1, INV2, INV3, and INV4 will be powered normally in each memory element 20.

At step 82, control circuit 24 may take complement data signals NDATA low for certain columns in array 28 to prepare for the loading of data one values into the cells of an addressed row of array 28. The state of NDATA in each column may be determined by the output of a data register in control circuitry 24. Using this approach, the values of NDATA may be high for some columns of array 28 and may be low for other columns of array 28. In general, any suitable number of NDATA signals may be held low. Arrangements in which control circuit 24 holds NDATA low for more than one column at the same time allow data one values to be written into multiple memory elements 20 in parallel.

At step 84, control circuit 24 can take the address signal ADDR high in a given row of array 28. The address transistors N2A and N4A in those memory elements 20 for which address signals ADDR is asserted and for which NDATA is low will be turned on. In these memory elements 20, the sources S of the address transistors are shorted to their drains D, pulling nodes 2 and 4 low. When nodes 2 and 4 are pulled low, transistor P1 in circuit INV1 will be turned on and transistor N1 will be turned off, taking node 1 high, while transistor P3 in circuit INV3 will be turned on and transistor N3 will be turned off, taking node 3 high. The address signal ADDR in the given row can then be deasserted (e.g., taken low) at step 86.

As a result of these operations, all memory elements 20 corresponding to low NDATA signals in the row in which ADDR was asserted will be loaded with logic ones. The memory elements in the same row that correspond to high NDATA signals will remain cleared (loaded with logic zeros).

If more rows in array 28 remain to be loaded with logic ones, processing can loop back to step 82, as indicated by line 88. If all desired memory elements 20 in array 28 have been loaded, data write operations are complete and integrated circuit 10 can be used in a system (step 90). In situations in which integrated circuit 10 is a programmable integrated circuit and in which memory array 28 is loaded with configuration data, each loaded memory element 20 may provide a corresponding static output control signal that configures a transistor or other component in programmable logic 18. The programmable logic that has been customized in this way may be used during the operations of step 90 to process system signals.

Immunity to soft error upset events may be enhanced by spatially separating the circuit components that may be subject to disturbance by a radiation strike. In particular, soft error upset immunity may be enhanced by forming transistor P1 and its redundant partner transistor P3 in different semiconductor regions (i.e., different n-wells). Other redundant transistor pairs (e.g., transistors P2 and P4, N1 and N3, N2 and N4) may likewise be isolated from each other by forming the transistors in these redundant pairs in respective wells (semiconductor regions). With this type of distributed arrangement, radiation strikes that disrupt the operation of one of these transistors will affect that transistor, but not its redundant partner.

For example, when a radiation strike arises in the n-well that contains transistor P1, the operation of transistor P1 can be disrupted by the electron-hole pairs and subsequent minority carrier diffusion that results from the radiation strike in the n-well. If transistor P3 were formed in the same n-well, these diffused carriers could adversely affect transistor P3 at the same time. The radiation strike would therefore have the potential to disrupt not only node 1 at the output of transistor P1, but node 3 at the output of transistor P3, thereby potentially causing memory element 20 to flip states. If, on the other hand, transistors P1 and P3 are isolated by forming transistors P1 and P3 in different n-wells, a radiation strike on transistor P1 could affect the signal on node 1, but would not directly affect the signal on node 3. The undisturbed value of the node 3 signal would therefore serve as a stabilizing signal that helps to restore memory element 20 to its original state even in the presence of the strike on transistor P1.

In memory cell 20, transistors P1 and P3 form a redundant pair and can be isolated using separate semiconductor regions. Transistors P2 and P4 likewise form a redundant pair and can be isolated using separate semiconductor regions. Transistors N1 and N3 are redundant in the same way and can be isolated by forming each of these transistors in a separate semiconductor regions. Isolated semiconductor regions may also be used in forming transistors N2B and N4B. The semiconductor region in which a metal-oxide-semiconductor transistor is formed is typically an n-well (for PMOS transistors) or a p-well (for NMOS transistors). In some situations, the semiconductor region in which a transistor is formed is part of a larger semiconductor substrate region (e.g., a p-type substrate), rather than a doped well. More typically (particularly for PMOS devices), transistors are formed in smaller well structures. Doped semiconductor wells can be formed using ion implantation, diffusion, or other suitable semiconductor fabrication techniques.

Figure 9:
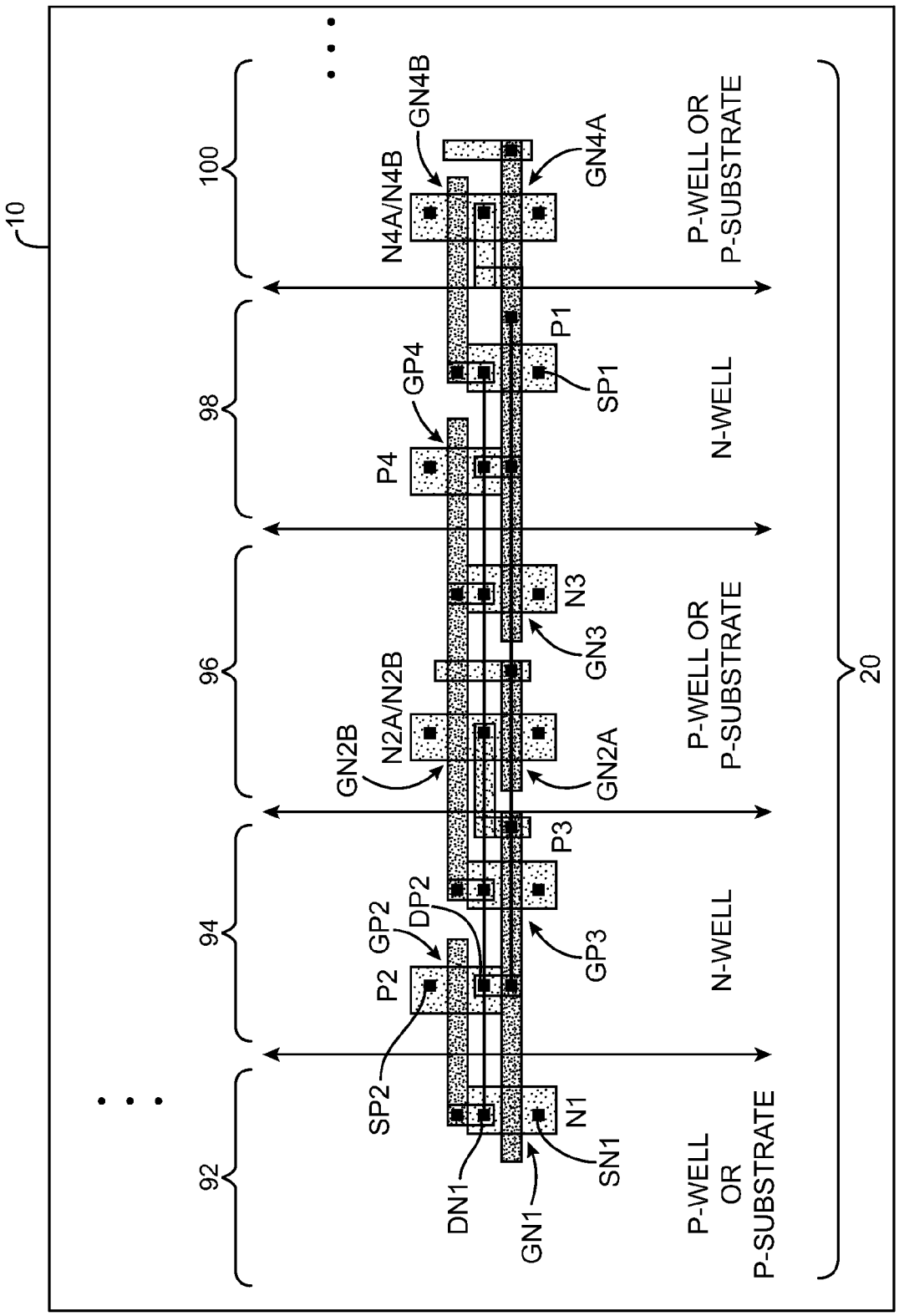
FIG. 9 is a top view of an illustrative layout that may be used for a memory cell in accordance with an embodiment of the present invention.

An illustrative layout that may be used in forming the transistors of a memory element such as the memory elements of FIGS. 3 and 6 is shown in FIG. 9. As shown in the integrated circuit top view of FIG. 9, memory elements 20 may be formed in one or more vertical stripes on integrated circuit 10. Each vertical stripe may include stripe-shaped semiconductor regions 92, 94, 96, 98, and 100. Regions 92, 96, and 100 may be p-type doped semiconductor regions. Regions 94 and 98 may be n-type doped semiconductor regions. The depth of these doped semiconductor regions (into the page) may be a fraction of a micron to a micron or more, as determined by the semiconductor fabrication process that is being used to fabricate integrated circuit 10.

When the substrate on which integrated circuit 10 is being fabricated is a p-type silicon substrate, semiconductor regions 92, 96, and 100 may, if desired, be formed from regions of p-type silicon substrate. N-type semiconductor regions 94 and 98 are typically formed by ion-implantation, which forms n-type wells within the p-type substrate.

The sources and drains of the transistors of memory elements 20 may be formed from highly doped ion implantation regions (as an example) that are fabricated within the doped semiconductor regions 92, 94, 96, 98, and 100. Some of the gates, sources, and drains of the transistors of a given memory element 20 are labeled in FIG. 9. For example, transistor N1 has a gate GN1 and has a source SN1 and drain DN1 formed from heavily doped n-type regions within p-type semiconductor region 92.

As the illustrative layout of FIG. 9 demonstrates, isolation between redundant transistors can be enhanced by forming each of the transistors in a redundant pair in a separate doped semiconductor region. For example, source SN1 and drain DN1 of transistor N1 are formed within p-type region 92, whereas the source and drain of its redundant partner N3 are formed within a separate p-type semiconductor region (region 96). These regions are spatially distant from each other and are separated by an interposed region of opposite doping type (i.e., n-well 94), so minority carriers that are formed by a radiation strike in one region (e.g., region 92) will not diffuse into the other region (e.g., region 96). The other redundant transistor pairs in memory element 20 may similarly be formed in separate semiconductor regions to enhance the stability of memory element 20 during soft error upset events.

Figure 10:
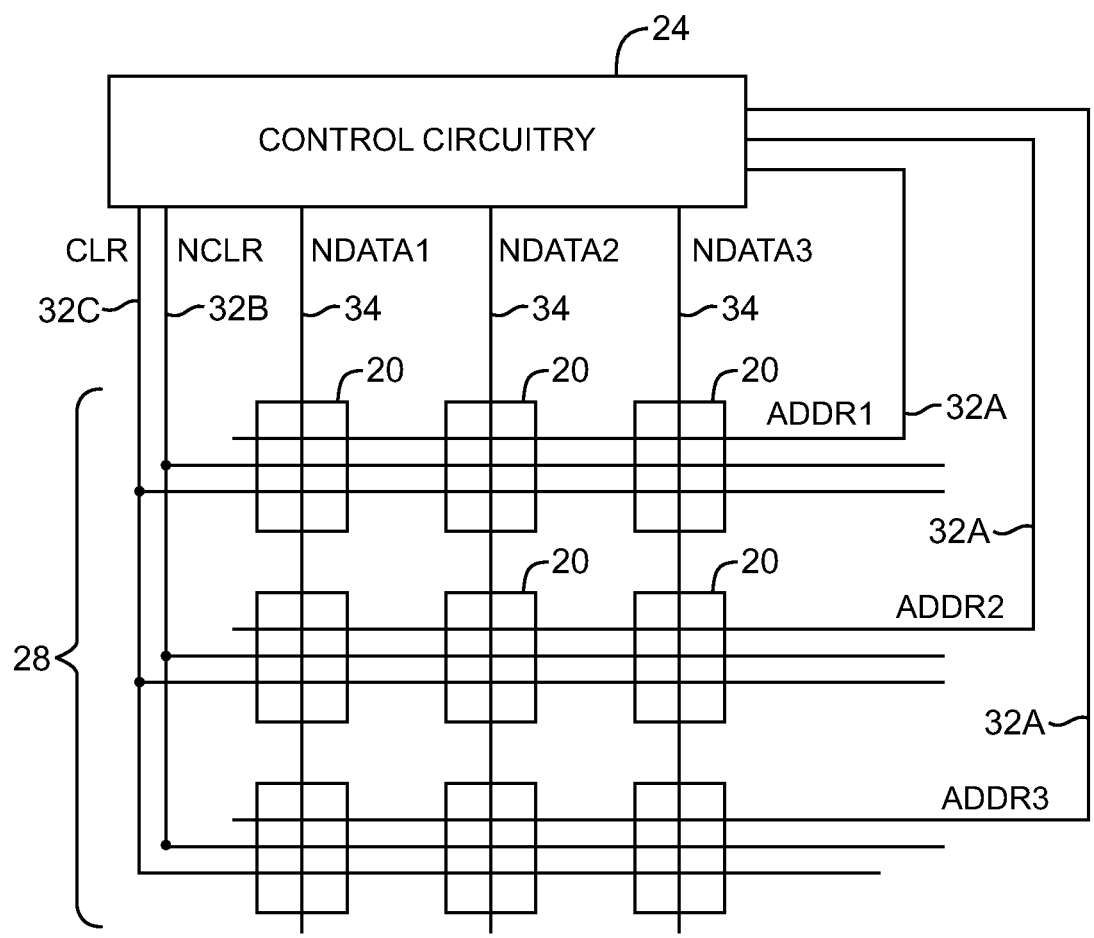
FIG. 10 is a circuit diagram showing signal lines that may be used in controlling a memory element array in accordance with an embodiment of the present invention.

FIG. 10 shows an illustrative set of signal distribution paths that may be used in routing clear signals, data signals, and address signals between control circuitry 24 and memory elements 20 in array 28. As shown in FIG. 10, clear signals such as true clear signal CLR and complement clear signal NCLR may be globally distributed using global distribution paths such as paths 32C and 32B. Address signals may be distributed to multiple memory elements in a row. In the FIG. 10 example, address signal ADDR1 is distributed to each of the memory elements 20 in the first row of array 28, address signal ADDR2 is distributed to each of the memory elements 20 in the second row of array 28, and address signal ADDR3 is distributed to each of the memory elements 20 in the third row of array 28. Data signals NDATA1, NDATA2, and NDATA3 are conveyed between circuitry 24 and respective columns of memory elements 20 using data lines 34 (i.e., complement data lines).

The foregoing is merely illustrative of the principles of this invention and various modifications can be made by those skilled in the art without departing from the scope and spirit of the invention.

What is claimed is:

1. A method for operating a memory element that includes a first inverting circuit with transistors coupled in series between first and second power supply lines and that includes a second inverting circuit with transistors coupled in series between third and fourth power supply lines, the method comprising:
   deactivating the first and second inverting circuits by asserting control signals on the first and third power supply lines; and
   while the control signals are asserted, loading a first value into the memory element.

2. The method defined in claim 1, wherein asserting the control signal on the first power supply line comprises biasing the first and second power supply lines to identical voltage levels.

3. The method defined in claim 1, further comprising:
   activating the first and second inverting circuits by deasserting the control signals on the first and third power supply lines.

4. The method defined in claim 1, further comprising:
   while the control signals are deasserted, loading a second value that is different than the first value into the memory element.

5. The method defined in claim 1, wherein loading the first value into the memory element comprises loading the first value into the second inverting circuit.

6. The method defined in claim 1, wherein the memory element further comprises an access circuit that is connected to the second inverting circuit but not to the first inverting circuit, and wherein loading the first value into the memory element comprises activating the access circuit to load the first value into the memory element.

7. The method defined in claim 1, wherein asserting the control signals on the first and third power supply lines comprises applying a first power supply voltage onto the first power supply line and applying a second power supply voltage that is different than the first power supply voltage onto the second power supply line.

8. A method for operating a memory element that includes at least one inverting circuit having first and second transistors coupled in series between first and second power supply lines, the method comprising:
   powering the inverting circuit by supplying the first and second power supply lines with power supply voltages; and
   receiving a signal that is not actively driven with the first transistor in the inverting circuit.

9. The method defined in claim 8, further comprising:
   receiving another signal that is not actively driven with the second transistor in the inverting circuit.

10. The method defined in claim 8, wherein powering the inverting circuit comprises supplying power supply voltages with different voltage levels to the first and second power supply lines.

11. The method defined in claim 8, further comprising:
   deactivating the inverting circuit by supplying power supply voltages with identical voltage levels to the first and second power supply lines.

12. The method defined in claim 8, wherein the memory element further includes an additional inverting circuit, the method further comprising:
- with the additional inverting circuit, providing the signal to the first transistor.

13. The method defined in claim 12, wherein the additional inverting circuit includes third and fourth transistors coupled in series between third and fourth power supply lines, the method further comprising:
- during a first time period, deactivating the additional inverting circuit by biasing the third and fourth power supply lines to identical voltage levels to provide the signal that is not actively driven to the first transistor.

14. The method defined in claim 13, further comprising:
- during a second time period that is different than the first time period, biasing the third and fourth power supply lines to different voltage levels to provide a signal that is actively driven to the first transistor.

15. Memory element circuitry, comprising:
- first and second power supply lines on which fixed power supply voltages are provided;
- a third power supply line on which a first adjustable control signal is provided;
- a fourth power supply line on which a second adjustable control signal is provided;
- a first inverting circuit having transistors coupled in series between the first and third power supply lines, wherein the first inverting circuit has an output on which a data bit is stored; and
- a second inverting circuit that is coupled to the first inverting circuit, wherein the second inverting circuit has transistors coupled in series between the second and the fourth power supply lines, and wherein the second inverting circuit has an output on which a data bit having the same value of the data bit at the output of the first inverting circuit is stored.

16. The memory element circuitry defined in claim 15, wherein the first and second power supply lines carry different power supply voltages.

17. The memory element circuitry defined in claim 15, further comprising:
- an address circuit coupled to the second inverting circuit, wherein no address circuit is connected to the first inverting circuit.

18. The memory element circuitry defined in claim 15, further comprising:
- a third inverting circuit that is coupled to the second inverting circuit, wherein the third inverting circuit have transistors coupled in series between the first and third power supply lines.

19. The memory element circuitry defined in claim 15, further comprising:
- control circuitry that is configured to assert the first adjustable control signal to deactivate the first inverting circuit while loading a first value into the memory element.

20. The memory element circuitry defined in claim 19, wherein the control circuitry is further configured to deassert the first adjustable control signal to activate the first inverting circuit while loading a second value that is different than the first value into the memory element.

21. The memory element circuitry defined in claim 19, wherein the control circuitry is further configured to assert the second adjustable control signal on the fourth power supply line to deactivate the second inverting circuit while loading the first value into the memory element.

* * * * *